United States Patent [19]

Forrester

[11] 4,426,617
[45] Jan. 17, 1984

[54] AUDIBLE TEST DEVICE
[75] Inventor: Lester L. Forrester, Cucamonga, Calif.
[73] Assignee: General Dynamics, Pomona Division, Pomona, Calif.
[21] Appl. No.: 388,821
[22] Filed: Jun. 16, 1982
[51] Int. Cl.³ .................... G01R 27/02; G01R 19/14
[52] U.S. Cl. ........................................ 324/62; 324/133
[58] Field of Search ................ 324/62, DIG. 1, 133, 324/63, 64; 340/384 E, 511, 515, 517, 653

[56] References Cited

U.S. PATENT DOCUMENTS

| | | |
|---|---|---|
| 2,824,299 | 1/1958 | Haines et al. |
| 3,173,136 | 3/1965 | Atkinson |
| 3,204,183 | 8/1965 | Hasenzahl |
| 3,221,317 | 11/1965 | Ferrigno, Jr. |
| 3,284,707 | 11/1966 | Clinton |
| 3,304,547 | 2/1967 | Bristol |
| 3,551,906 | 12/1970 | Cooper |
| 3,569,963 | 3/1971 | Mallory et al. |
| 3,628,099 | 12/1971 | Atkins ........................... 324/62 R X |
| 3,686,654 | 8/1972 | Judlowe .............................. 340/517 |
| 3,689,832 | 9/1972 | Leto et al. |
| 3,758,855 | 9/1973 | Meyer |
| 3,784,906 | 1/1974 | Ironside .................... 324/DIG. 1 X |
| 3,805,155 | 4/1974 | Tsuda et al. |
| 3,903,471 | 9/1975 | Hiraga et al. |
| 4,053,785 | 10/1977 | Lee ................................... 340/515 X |
| 4,053,874 | 10/1977 | Glaser .................................. 340/515 |
| 4,062,006 | 12/1977 | Solheim ............................. 340/515 |
| 4,139,842 | 2/1979 | Fujita et al. |
| 4,164,735 | 8/1979 | Salem |

OTHER PUBLICATIONS

I. M. Attrill, "Modulated Alarm Generator: Frequency Modulated Audio Alarm With 10 Watt Output", Radio and Electronics Constructor (Great Britain), vol. 33, No. 10, Jun. 1980, pp. 598-600.

Primary Examiner—Stanley T. Krawczewicz
Assistant Examiner—Jose M. Solis
Attorney, Agent, or Firm—Henry M. Bissell; Edward B. Johnson

[57] ABSTRACT

An audible test device which provides a tone when a resistance being measured is less than a selected value, the selected value being variable to a few milli-ohms. A first or second source of voltage is applied to a constant current source. The constant current generated is divided between two paths, one path including test leads holding the resistance being measured therebetween, the other path through a voltage adjusting device. The output from the voltage adjusting device is applied to one input of a voltage comparator, the voltage appearing across the resistance under test being applied to the other input of the voltage comparator. The output of the comparator is applied to a voltage controlled oscillator (VCO), the output of the VCO being applied to a piezoelectric device and to a speaker operable only when the second voltage source is utilized, thereby generating an audible tone. To set the threshold below which the audible tone will be generated, test leads are placed across a known resistance value equal to the threshold desired and the voltage adjusting device is adjusted until a tone is heard. This occurs only when the output of the voltage adjusting device exceeds the voltage across the resistance under test, the output of the comparator causing the VCO to generate an output. Thereafter, when the test leads are placed across a circuit path or resistance under test having a resistance value below the set desired value, a tone will be emitted.

12 Claims, 1 Drawing Figure

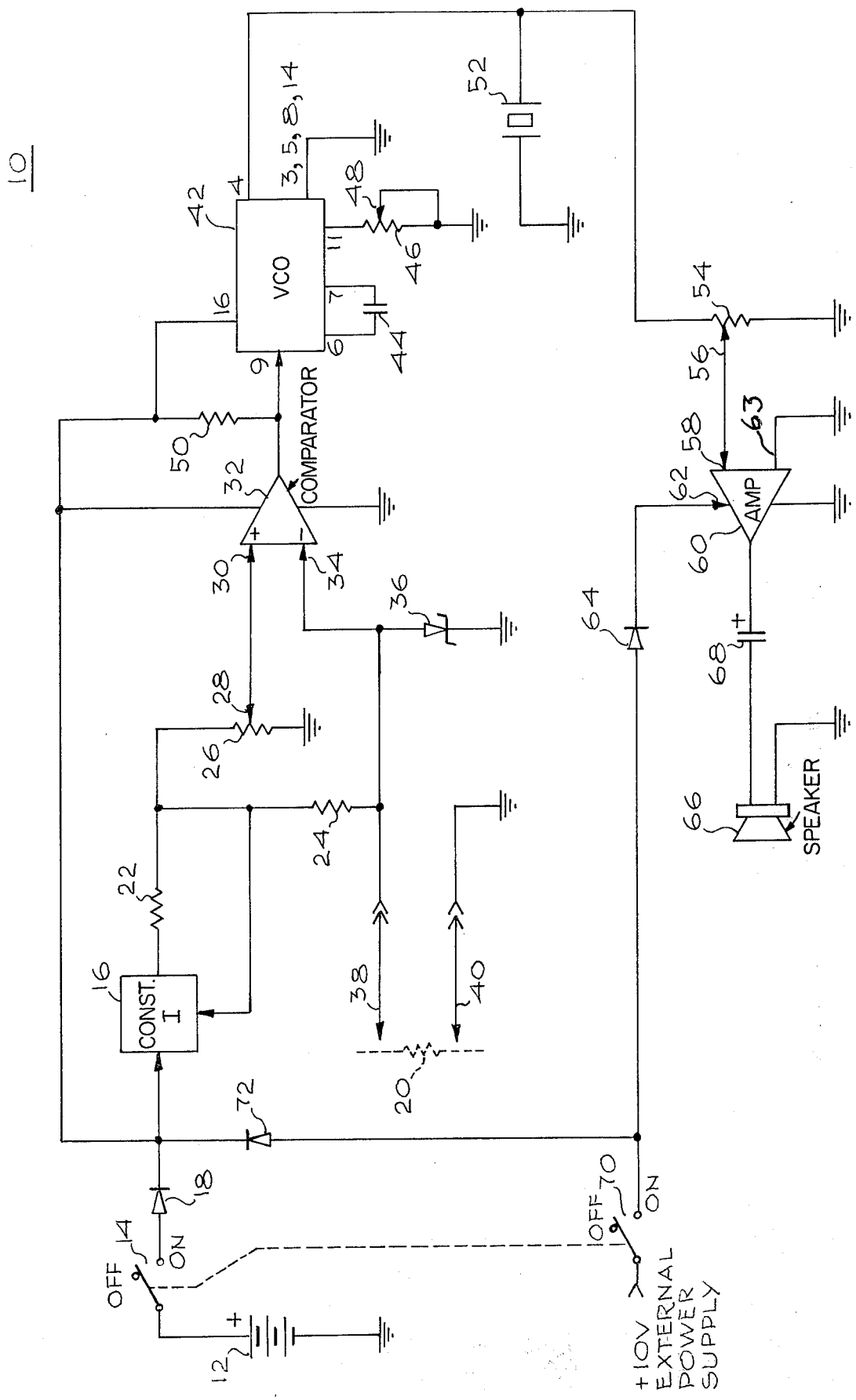

AUDIBLE TEST DEVICE

The Government has rights in this invention pursuant to Contract No. DAAK40-77-C-0122, awarded by the United States Army.

BACKGROUND OF THE INVENTION

1. Field of the Invention

This invention relates to measuring instruments and, more particularly, to instruments for testing circuit resistance and providing an audible tone upon the detection of resistance below a selected value.

2. Description of the Prior Art

Audible test devices for use in testing electrical or electronic equipment for electrical continuity and for measuring resistance have long been available in the prior art. For example U.S. Pat. No. 3,284,707 discloses a continuity or resistance testing device having an audible output, the tone of which varies with the test resistance. Circuit parameters are preselected such that the highest audio tone will be produced if the value of the resistance under test is zero and the lowest audio tone will be produced if the value of the resistance under test reaches infinity (open circuit condition). Other values of the test resistance between the two extreme values will cause audio tones to be produced intermediate the two limiting rates and, as a result, the patent disclosure indicates that a user would be able to distinguish between the values of different test resistances by the frequency of the audible tone produced.

U.S. Pat. No. 3,758,855 discloses a resistance controllable indicator which includes a frequency generating circuit, the frequency of which is inversely proportional to the value of the test resistance. A speaker may be used to indicate resistance values, the circuit component values being adjusted to provide a frequency response within the audible range.

Test circuits for indicating distinct voltage levels by audible means have also been developed. For example, U.S. Pat. No. 3,903,471 discloses an electronic test circuit that produces several audio tones that correspond to one of several digital logic voltage levels which allows the testing of microelectronic equipment audibly rather than visually, as with an oscilliscope or voltmeter. When the circuit under test is at a high voltage level, an oscillator is energized so that the sound signal with a predetermined frequency may be heard through a transducer. If a low voltage level is detected, a sound signal with a frequency different from that of the sound indicating the high voltage level will be produced.

Although U.S. Pat. Nos. 3,284,707, 3,689,832, and 3,758,855 disclose circuits which generate an audio tone that varies with measured resistance, the resistance sensitivity of each is such that the frequency produced within the range of from a few milli-ohms to a few ohms would hardly be noticeable. Although these references indicate that operable ranges from 0 to 1000 ohms can be achieved, if the user is concerned about resistance values of, for example, 1/100 ohm, ⅛ ohm or 1 ohm, these devices would be inadequate. It would also be extremely difficult for a user to audibly distinguish between slight variations in frequency over a comparatively large resistance range in order to accurately determine the test resistance value.

SUMMARY OF THE PRESENT INVENTION

In brief, arrangements in accordance with the present invention comprise an audible test device which generates a tone when a resistance being measured is less than a selected value, the selected value being variable to a few milli-ohms. A first or second source of voltage is applied to a constant current source. The constant current generated is divided between two paths, one path including test leads holding the resistance being measured therebetween, the other path through a voltage adjusting device. The output from the voltage adjusting device is applied to one input of a voltage comparator, the voltage appearing across the resistance under test being applied for the other input of the voltage comparator. The output of the comparator is applied to a voltage controlled oscillator (VCO), the output of the VCO being applied to a piezoelectric device and to a speaker operable when the second voltage source is utilized, thereby generating an audible tone. To set the threshold below which the audible tone will be generated, test leads are placed across a known resistance value equal to the threshold desired and the voltage adjusting device is adjusted until a tone is heard. The tone occurs when the output of the voltage adjusting device exceeds the voltage across the resistance under test, the output of the comparator causing the VCO to generate an output. Thereafter, when the test leads are placed across a circuit path or resistance below the set desired value, a tone will be emitted.

DESCRIPTION OF THE DRAWING

A better understanding of the present invention may be had from a consideration of the following detailed description, taken in conjunction with the accompanying drawing in which:

The sole FIGURE is a schematic diagram of an electrical circuit embodying the invention.

DESCRIPTION OF THE PREFERRED EMBODIMENT

Referring now to the sole FIGURE of the drawing, a schematic diagram of the audible test device 10 of the present invention is illustrated. The device 10 is compact, can be hand-held and is powered by an internal 9-volt battery 12. An on-off switch 14 is provided to couple voltage source or battery 12 to constant current source 16 via steering diode 18. For design reasons, the constant current source 16 comprises a positive 1.2-volt voltage regulator configured as a 5-Ma constant current source and provides constant current through circuit path 20 (illustrated by dashed lines) via resistances 22 and 24. The output of current source 16 is coupled, via resistor 22, to one terminal of potentiometer 26 having an adjustable tap 28 (the other terminal of potentiometer 26 is coupled to ground) and to the return input of current source 16. The adjustable tap 28 is connected to the positive input terminal 30 of voltage comparator 32, the negative input terminal 34 of comparator 32 being connected to ground via Schottky diode 36 and to the junction between resistor 24 and a test lead 38. The other test lead 40 is connected to ground. The output of comparator 32 is connected to pin 9 of IC phase-lock-loop 42 (selected for design reasons) and configured such that the VCO portion thereof is utilized. Pins 6 and 7 of IC 42 are connected together via capacitor 44; pin 11 is connected to one terminal of potentiometer 46 having an adjustable tap 48, the other terminal of potentiometer 46 being grounded; pins 3, 5, 8 and 14 are grounded. Pin 16 is connected to one terminal of resistor 50, the other terminal of which is connected to the output of comparator 32. An output pin 4 is connected across piezoelectric crystal 52 and to one terminal of potentiometer 54 having an adjustable tap 56. The output of adjustable tap 56 is connected to input 58 of power amplifier 60. Input 63 of amplifier 60 is grounded and an external power supply, if required as explained hereinafter, is applied to amplifier 60 via steering diode 64. The output of amplifier 60 is applied to an 8-ohm speaker 66 via capacitor 68. As shown, the external 10-volt power supply is applied to device 10 via on-off switch 70, switch 70 being mechanically coupled to switch 14. The external power supply is applied to the input of constant current source 16 via steering diode 72.

In operation, diodes 18 and 72 are steering diodes for the circuit power. With only battery 12 applied, current will flow through diode 18 when switch 14 is moved to the on position. When the external power supply is applied where increased tone volume is required, current will only flow through diode 72 when the voltage exceeds 9.5 volts (diode 18 is back-biased at this voltage level). As set forth hereinabove, constant current source 16 provides current to potentiometer 26 and Schottky diode 36 insures that the voltage drop across the resistance in circuit path 20 being measured will not exceed 0.45 volts positive and thus, in the embodiment illustrated, limits the maximum resistance value which can be detected (i.e. 50 ohms). Obviously, a Schottky diode having different operating parameters can be substituted to increase or decrease this limit.

Voltage comparator 32 compares the voltage at tap 28 of potentiometer 26 with the voltage at the junction of the resistor divider formed by resistor 24 and the resistance or circuit path 20 being measured, the junction being connected to comparator terminal 34. When the voltage at terminal 34 is more positive than the voltage at terminal 30, the output voltage of comparator 32 will be zero and there will be a very low impedance to ground at the comparator output. When the voltage at terminal 30 is more positive than the voltage at terminal 34, the voltage at the output of comparator 32 will be pulled up to be very near the supply voltage by resistor 50 and there will be a very high impedance to ground at the comparator output.

Pin 9 of IC 42 is the control line input of the VCO function and pin 4 is the oscillator output. When pin 9 is held at zero volts by comparator 32 (voltage at terminal 34 greater than the voltage at terminal 30), the VCO frequency is driven to zero. When pin 9 is pulled high by comparator 32 (voltage at terminal 30 is greater than voltage at terminal 34), the VCO frequency is driven to an audible tone. Capacitor 44 and resistor 46 (as set by tap 48) will determine the VCO operating frequency and thus the tone which is emitted by piezoelectric crystal 52 when an audio oscillating voltage is applied to it. Crystal 52 appears as very high impedance load to IC 42 and provides an audio tone with minimal current drain on battery 12.

If more audio volume is required than crystal 52 can provide, the device of the present invention provides the capability to meet this requirement. In particular, a ten-volt external power supply is connected to the test device 10 and switch 70 is moved to the on position. Diode 64 couples the power-on voltage to IC audio power amplifier 60 via terminal 62. The output voltage from IC 42 at pin 4 is applied to potentiometer 54 and tap 58 applies a predetermined portion of that voltage to amplifier 60. The output of amplifier 60 is applied to speaker 66 via capacitor 68, causing the speaker to emit an audible tone. Amplifier 60, it should be noted, is only powered by the external positive power supply and thus will not drain battery 12.

Although in the preferred embodiment of the present invention test device 10 will emit a tone only when a resistance or circuit path being measured is less than a selected threshold value, it should be noted that an alternate embodiment can be provided wherein the tone is emitted only when the resistance or circuit path is greater than the threshold value.

To set the threshold in the preferred embodiment, test leads 38 and 40 are initially placed across a known value resistance equal to the desired threshold value. If, for example, the circuit paths of a device under test (a printed wiring board, for example) must have less than 500 milli-ohms resistance to be acceptable, leads 38 and 40 are placed across a known 500 milli-ohm resistor. Tap 28 is then adjusted (threshold sensitivity control) until a tone just begins to be heard. Leads 38 and 40 are then removed from the known resistance. Thereafter, when leads 38 and 40 are placed across the circuit path of resistance below 500 milli-ohms, a tone will be emitted. It should be noted that the circuit parameters are selected so that the range of the threshold sensitivity is within the desired test range.

It should be clear from the above example that the present invention enables very low resistances on the order of a few thousandths of an ohm to be accurately and quickly detected. A preferred range of operation for test device 10 is from about 100 milli-ohms to about 50 ohms. The audible tone is only generated when the test resistance is less than the selected value. This "tone/no tone" presentation is clearly distinguishable to a user, as opposed to a slight variation over a comparatively larger resistance range as shown in the prior art.

If test leads 38 and 40 are not placed across a resistance or circuit path when voltage is applied to test device 10, the circuit parameters selected provide for the voltage at terminal 34 to be greater than the voltage at terminal 30 of comparator 32 such that an audible tone is not emitted.

In the exemplary operating embodiment of the circuit shown, the following circuit components and parameters are employed:

Diodes 18, 64, 72: Texas Instruments type IN914
Voltage Regulator 16: National Semiconductor type LM117
Resistor 22: 240 ohms
Resistor 24: 1 ohm
Resistors 26, 46, 54: 0—100K ohms
Resistor 50: 40K ohms
Schottky Diode 36: Hewlett-PACKARD type IN5711
Comparator 32: National Semiconductor type LM139
IC 42: RCA type CD4046
Capacitor 44: 0.01 microfarads
Amplifier 60: National Semiconductor type LM380
Capacitor 68: 68 microfarads
Piezoelectric Crystal 52: Matsushita type EFB-S93B21

Although there have been described above specific arrangements of an audible test devices in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A test device for providing an audible tone when the resistance of a circuit path being tested is less than a selectable preset resistance value comprising:
   a first source of voltage;
   constant current source means selectively responsive to said first source of voltage for generating a current;
   means for directing a first portion of said current to a first path;
   adjustable means in said first path for generating a first voltage proportional to said first current portion and representing said preset resistance value;
   means for directing a second portion of said current to a second path which includes said test resistance, a second voltage proportional to said second current portion being developed across said test resistance;
   means for comparing said first and second voltages and generating an output signal when and only when said first voltage is greater than said second voltage; and
   means responsive to said output signal for generating an audible tone, said audible tone being generated only when said test resistance is less than said preset resistance value.

2. The test device of claim 1 wherein said audible tone generating means comprises a piezoelectric crystal.

3. The test device of claim 1 further including a second source of voltage connected to said current source means, said test device including means for inhibiting application of said first voltage source to the current source means when said second voltage source is applied.

4. The test device of claim 3 wherein said audible tone generating means comprises an audio power amplifier and speaker, said second source of voltage also being applied to said audio power amplifier to enable its operation.

5. The test device of claim 4 wherein said audible tone generating means further comprises a piezoelectric crystal.

6. The test device of claim 1 further including oscillator means interposed between said comprising means and said audible tone generating means for generating a signal having a predetermined frequency in the audio range only when the first voltage is greater than the second voltage.

7. The test device of claim 6 further including means for adjusting said predetermined frequency.

8. The test device of claim 1 wherein said preset resistance value is in the range from about 100 milliohms to about 50 ohms.

9. The test device of claim 8 wherein said preset resistance value is less than 1 ohm.

10. The test device of claim 1 including a threshold voltage device in said second current path for limiting to a predetermined maximum value.

11. A method for providing an audible tone when a resistance being tested is less than a selectable preset resistance value comprising the steps of:
    providing a source of voltage;
    generating a constant current in reponse to said voltage;
    directing a first portion of said current to a first path and providing an adjustable first voltage responsive thereto;
    directing a second portion of said current to a second path which includes a known resistance held between test leads and having a value equal to said preset resistance value, a second voltage proportional to said preset resistance value being developed across said known resistance;
    comparing said first and second voltages and adjusting said first voltage until a first signal is generated as a result of said comparison;
    generating an audible tone in response to said first signal;
    removing said known resistance from said test leads; and
    placing a test resistance path between said test leads, whereby said audible tone is subsequently generated only when the test resistance is less than said preset resistance value.

12. The method of claim 11 wherein said known resistance value is less than 1 ohm.

* * * * *